(12) United States Patent
Shao

(10) Patent No.: US 9,345,158 B2
(45) Date of Patent: May 17, 2016

(54) DUSTPROOF DEVICE

(71) Applicant: Wistron Corporation, New Taipei (TW)

(72) Inventor: Chia-Chi Shao, New Taipei (TW)

(73) Assignee: WINSTRON CORPORATION, New Taipei (TW)

(*) Notice: Subject to any disclaimer, the term of this patent is extended or adjusted under 35 U.S.C. 154(b) by 1 day.

(21) Appl. No.: 14/606,730

(22) Filed: Jan. 27, 2015

(65) Prior Publication Data
US 2016/0066455 A1    Mar. 3, 2016

(30) Foreign Application Priority Data
Aug. 28, 2014 (TW) .............................. 103129694 A

(51) Int. Cl.
*H01R 13/52*   (2006.01)
*H05K 5/03*   (2006.01)
*F16B 2/22*   (2006.01)

(52) U.S. Cl.
CPC .. *H05K 5/03* (2013.01); *F16B 2/22* (2013.01); *H01R 13/5213* (2013.01)

(58) Field of Classification Search
CPC .... H01R 13/5213; H01R 13/443; H05K 5/03; F16B 2/22
USPC .......................................... 439/136; 385/139
See application file for complete search history.

(56) References Cited

U.S. PATENT DOCUMENTS

| | | | | |
|---|---|---|---|---|
| 4,134,516 A * | 1/1979 | Sullo | ...................... | H02B 1/066 174/67 |
| 4,556,264 A * | 12/1985 | Tanaka | ............... | H01R 13/4367 439/135 |
| 4,789,348 A * | 12/1988 | Hampton | ........... | H01R 13/5213 439/142 |
| 5,637,002 A * | 6/1997 | Buck | .................... | H01R 13/443 439/148 |
| 6,041,155 A * | 3/2000 | Anderson | ............ | G02B 6/3825 385/139 |
| 6,188,825 B1 * | 2/2001 | Bandy | .................. | G02B 6/3825 359/511 |
| 6,287,133 B1 * | 9/2001 | Yang | .................. | H01R 13/4536 439/138 |
| 6,309,247 B1 * | 10/2001 | Wang | .................. | H01R 13/5213 439/135 |
| 6,547,450 B2 * | 4/2003 | Lampert | ............. | G02B 6/3849 385/139 |
| 7,164,840 B2 * | 1/2007 | Hsieh | .................. | G02B 6/3849 385/139 |
| 7,503,780 B1 * | 3/2009 | Huang | ............... | H01R 13/4538 439/135 |
| 7,706,657 B1 * | 4/2010 | McQuiggan | ......... | G02B 6/3825 385/134 |
| 7,722,378 B2 * | 5/2010 | Morrison | ........... | H01R 13/5213 439/344 |
| 7,945,139 B2 * | 5/2011 | Parkman, III | ........ | G02B 6/3849 385/139 |
| 8,849,085 B2 * | 9/2014 | Meadowcroft | ..... | H01R 13/5213 385/134 |
| 2005/0289572 A1 * | 12/2005 | Chen | .................. | G11B 33/1446 720/648 |
| 2006/0068638 A1 * | 3/2006 | Lin | .................... | H01R 13/5213 439/607.02 |
| 2010/0009561 A1 * | 1/2010 | Wu | .................... | H01R 13/5213 439/136 |
| 2011/0188818 A1 * | 8/2011 | Sun | ........................ | H01R 13/44 385/94 |
| 2014/0242855 A1 * | 8/2014 | Kan | .................... | H01R 13/5213 439/892 |

* cited by examiner

*Primary Examiner* — Briggitte R Hammond
(74) *Attorney, Agent, or Firm* — Brinks Gilson & Lione; John C. Bacoch

(57) ABSTRACT

A dustproof device includes a first component, a second component and an engaging mechanism. The first component includes a first plug body which is pluggable into the first standard connection port. The second component includes a second plug body which is pluggable into the second standard connection port. The engaging mechanism includes a first engaging part which is disposed on the first component, and a second engaging part which is disposed on the second component and which is removably engageable with the first engaging part. The first component is removably connected to the second component by virtue of removable engagement between the first engaging part and the second engaging part.

7 Claims, 6 Drawing Sheets

DUSTPROOF DEVICE

CROSS-REFERENCE TO RELATED APPLICATION

This application claims priority of Taiwanese Application No. 103129694, filed on Aug. 28, 2014.

FIELD OF THE DISCLOSURE

The disclosure relates to a dustproof device, and more particularly to a dustproof device for use in at least one standard connection port.

BACKGROUND OF THE DISCLOSURE

Currently, an electronic device generally has a plurality of connection ports for connecting the electronic device to a variety of external devices. Take notebook computer as an example, connection ports generally at least include a universal serial bus (USB) port, an RJ45 connection port and an audio connection port. Since these connection ports are exposed to the atmosphere when not in use, conventional dustproof devices may be used to protect the connection ports against dirt and moisture.

SUMMARY OF THE DISCLOSURE

An object of the present disclosure is to provide a dustproof device.

According to the present disclosure, a dustproof device is for use in a first standard connection port and a second standard connection port. The dustproof device includes a first component, a second component and an engaging mechanism. The first component includes a first plug body which is pluggable into the first standard connection port. The second component includes a second plug body which is pluggable into the second standard connection port. The engaging mechanism includes a first engaging part which is disposed on the first component, and a second engaging part which is disposed on the second component and which is removably engageable with the first engaging part. The first component is removably connected to the second component by virtue of removable engagement between the first engaging part and the second engaging part.

BRIEF DESCRIPTION OF THE DRAWINGS

Other features and advantages of the present disclosure will become apparent in the following detailed description of the embodiments with reference to the accompanying drawings, of which.

DETAILED DESCRIPTION OF THE EMBODIMENTS

Figure 1:
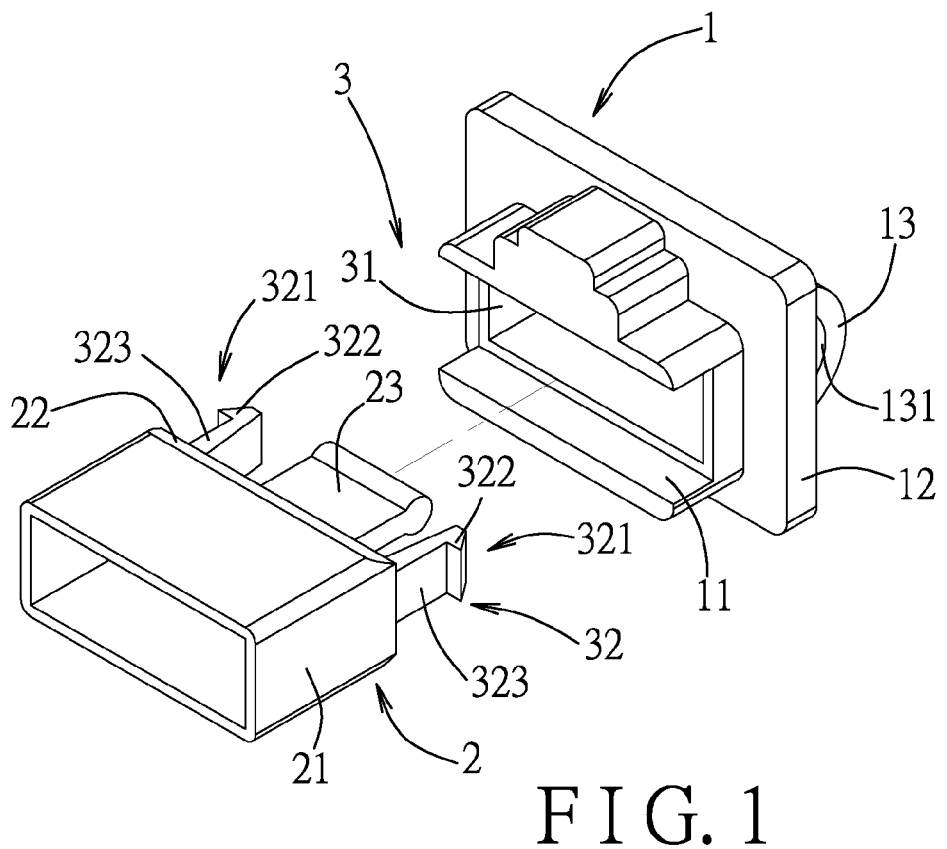
FIG. 1 is a perspective view illustrating the first embodiment of a dustproof device according to the present disclosure when a first component is separate from a second component.

Before the present invention is described in greater detail, it should be noted that the same reference numerals are used to denote like elements throughout the specification.

Figure 3:
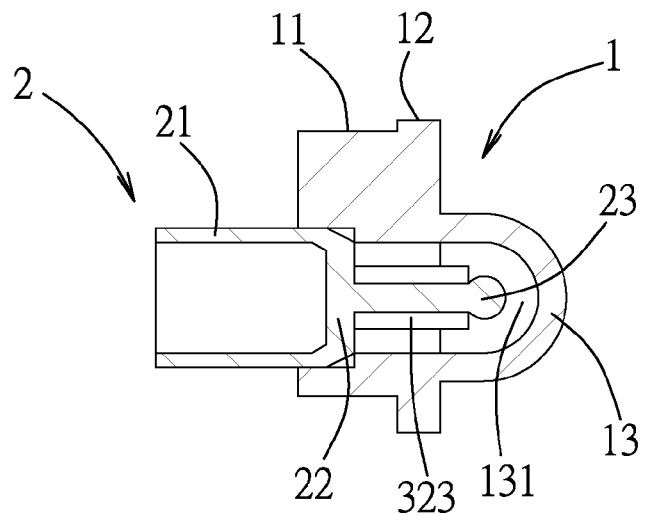
FIG. 3 is a sectional view of the first embodiment when the first component is connected to the second component.
Figure 5:
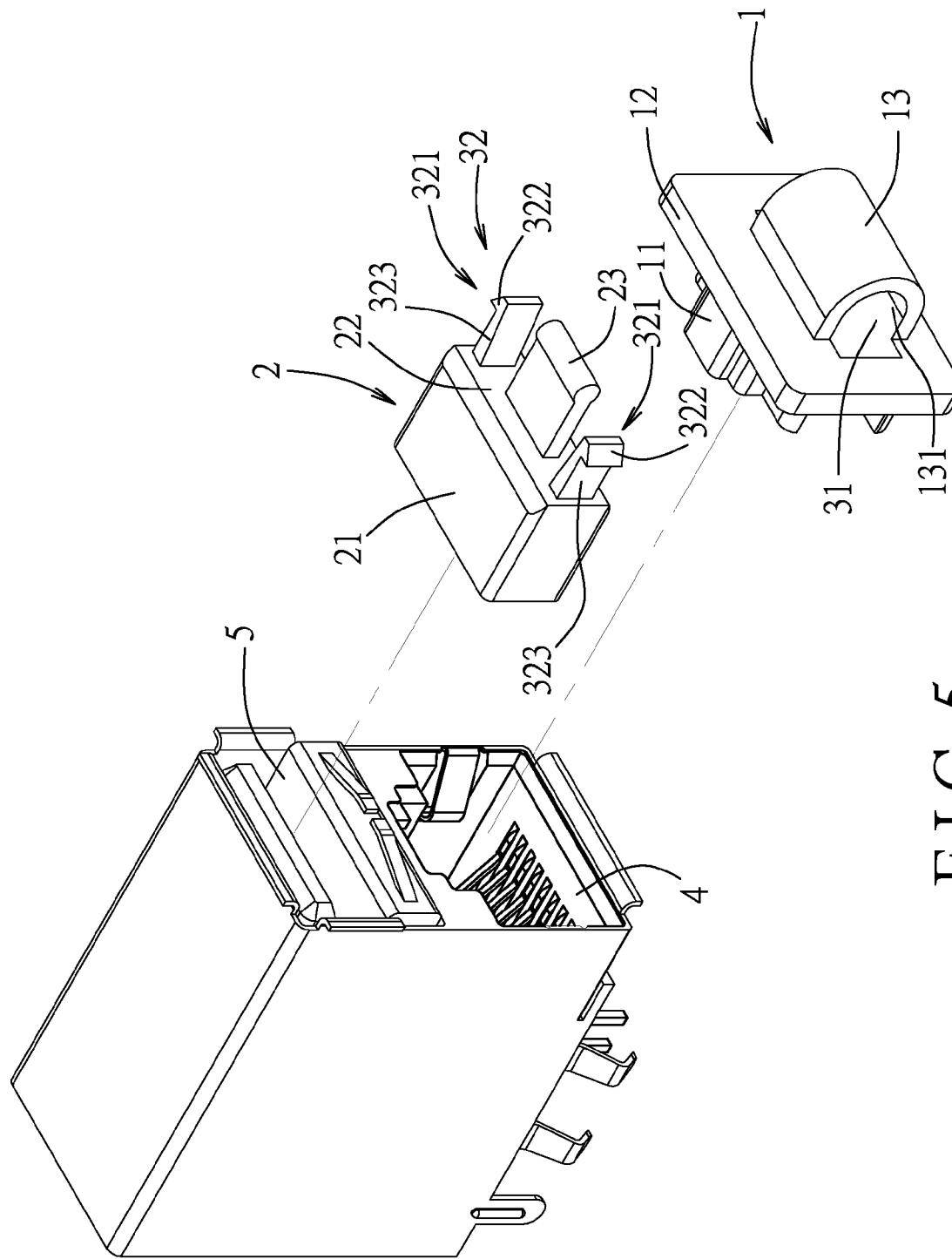
FIG. 5 is a perspective view illustrating relationships among the first component and the second component of the first embodiment, a first standard connection port and a second standard connection port in a first usage scenario.

Referring to FIGS. 1, 3 and 5, the first embodiment of a dustproof device according to the present disclosure is illustrated. The dustproof device includes a first component 1, a second component 2 and an engaging mechanism 3.

The first component 1 includes a first plug body 11 that is pluggable into a first standard connection port 4, a first base wall 12 that is connected to the first plug body 11, and a first puller 13 that is connected to the first base wall 12. The first base wall 12 is disposed between the first puller 13 and the first plug body 11. The first puller 13 has a receiving space 131. The first standard connection port 4 is illustrated as an RJ45 connector for exemplification purposes.

The second component 2 includes a second plug body 21 that is pluggable into a second standard connection port 5, a second base wall 22 that is connected to the second plug body 21, and a second puller 23 that is connected to the second base wall 22. The second base wall 22 is disposed between the second puller 23 and the second plug body 21. The second standard connection port 5 is illustrated as a universal serial bus (USB) connector for exemplification purposes.

Figure 2:
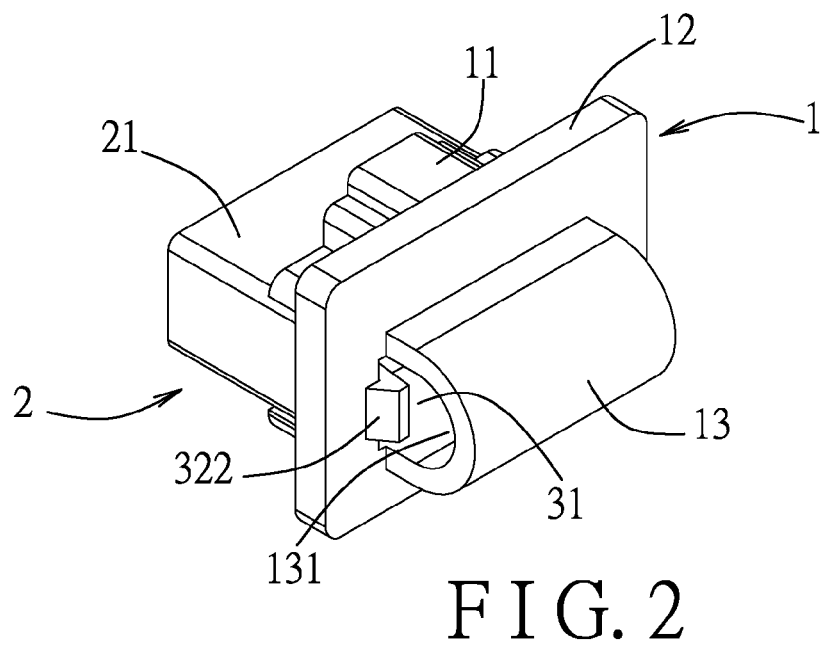
FIG. 2 is a perspective view of the first embodiment when the first component is connected to the second component.
Figure 4:
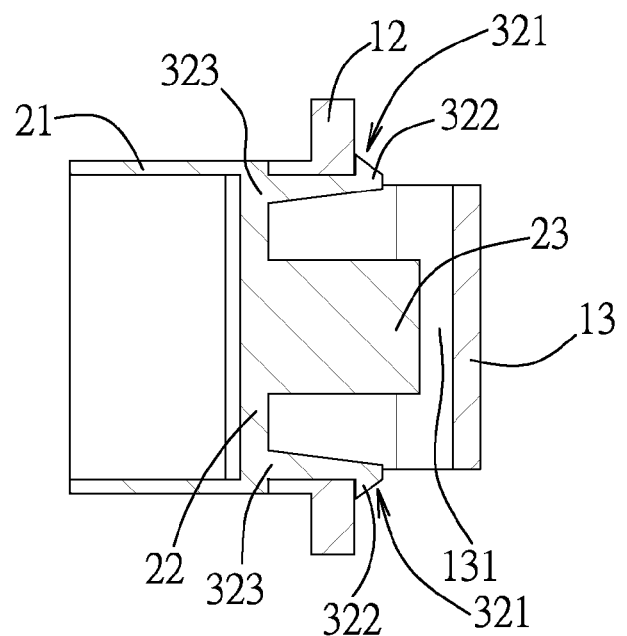
FIG. 4 is another sectional view of the first embodiment when the first component is connected to the second component.

Referring to FIGS. 1, 2 and 4, the engaging mechanism 3 includes a first engaging part which is disposed on the first component 1, and a second engaging part which is disposed on the second component 2 and which is removably engageable with the first engaging part. In this disclosure, the first engaging part of the engaging mechanism 3 is an engaging hole 31 that is formed in the first base wall 12. In this embodiment, the engaging hole 31 extends through the first base wall 12 and the first plug body 11. As such, the first plug body 11 is hollowed out due to the engaging hole 31 while still being complementary in shape to the first standard connection port 4. In addition, the receiving space 131 of the first puller 13 is in communication with the engaging hole 31. In this disclosure, the first puller 13 is substantially in the form of a hollow semi-cylindrical body that is connected to the first base wall 12 in opposition to the first plug body 11, and that defines the receiving space 131 opening toward the engaging hole 31 (see FIGS. 2 and 3).

In this disclosure, the second engaging part of the engaging mechanism 3 is a hook unit 32 that is disposed on an end of the second component 2 near the second puller 23. The hook unit 32 includes two hooks 321 that are respectively disposed on two opposite sides of the second puller 23. Each of the hooks 321 has a connection portion 323 that is connected to the second base wall 22, and a hook portion 322 that is connected to the connection portion 323. Specifically, the number of the hooks 321 may vary. Alternatively, the first engaging part can be the hook unit 32 and the second engaging part can be the engaging hole 31.

Referring to FIGS. 1 to 3, the first component 1 is removably connected to the second component 2 by virtue of removable engagement between the engaging hole 31 and the hook unit 32. When the first component 1 and the second component 2 are connected to each other (as shown in FIG. 2), the end of the second component 2 with the hook unit 32 extends into the hollowed first plug body 11. By virtue of the hooks 321 extending through the engaging hole 31, the hook portions 322 of the hooks 321 pass through the engaging hole 31 and engage with the first base wall 12 of the first component 1. In such a manner, the first plug body 11 and the second plug body 21 are disposed on a same side of the first base wall 12, and the second plug body 21 protrudes more than the first plug body 11 with respect to the first base wall 12. In other words, when the first component 1 and the second component 2 are connected to each other such that the first plug body 11 and the second plug body 21 are disposed on the same side of the first base wall 12, the second plug body 21 has a length greater than that of the first plug body 11 with respect to the first base wall 12. In addition, when the first component 1 and the second component 2 are connected to each other, the second puller 23 extends through the engaging hole 31 and is situated inside of the receiving space 131.

Figure 6:
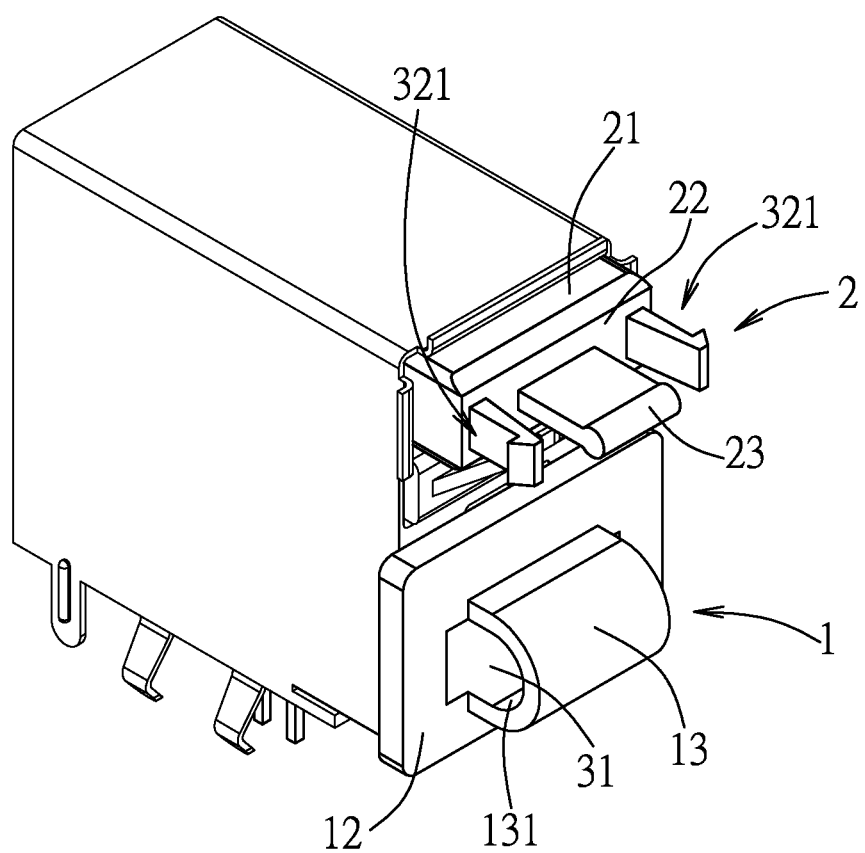
FIG. 6 is a perspective view of the first embodiment in the first usage scenario.

Referring to FIGS. 5 and 6, when both the first standard connection port 4 and the second standard connection port 5 are not in use, the first component 1 and the second component 2 are separate from each other and are respectively inserted into the first standard connection port 4 and the second standard connection port 5, such that the first standard connection port 4 and the second standard connection port 5 are prevented from dust.

When use of the first standard connection port 4 is required, the first puller 13 is pulled relative to the first standard connection port 4 to remove the first plug body 11 from the first standard connection port 4 and make the first standard connection port 4 available for use. Similarly, when use of the second standard connection port 5 is required, the second puller 23 is pulled relative to the second standard connection port 5 to remove the second plug body 21 from the second standard connection port 5 and make the second standard connection port 5 available for use.

Figure 7:
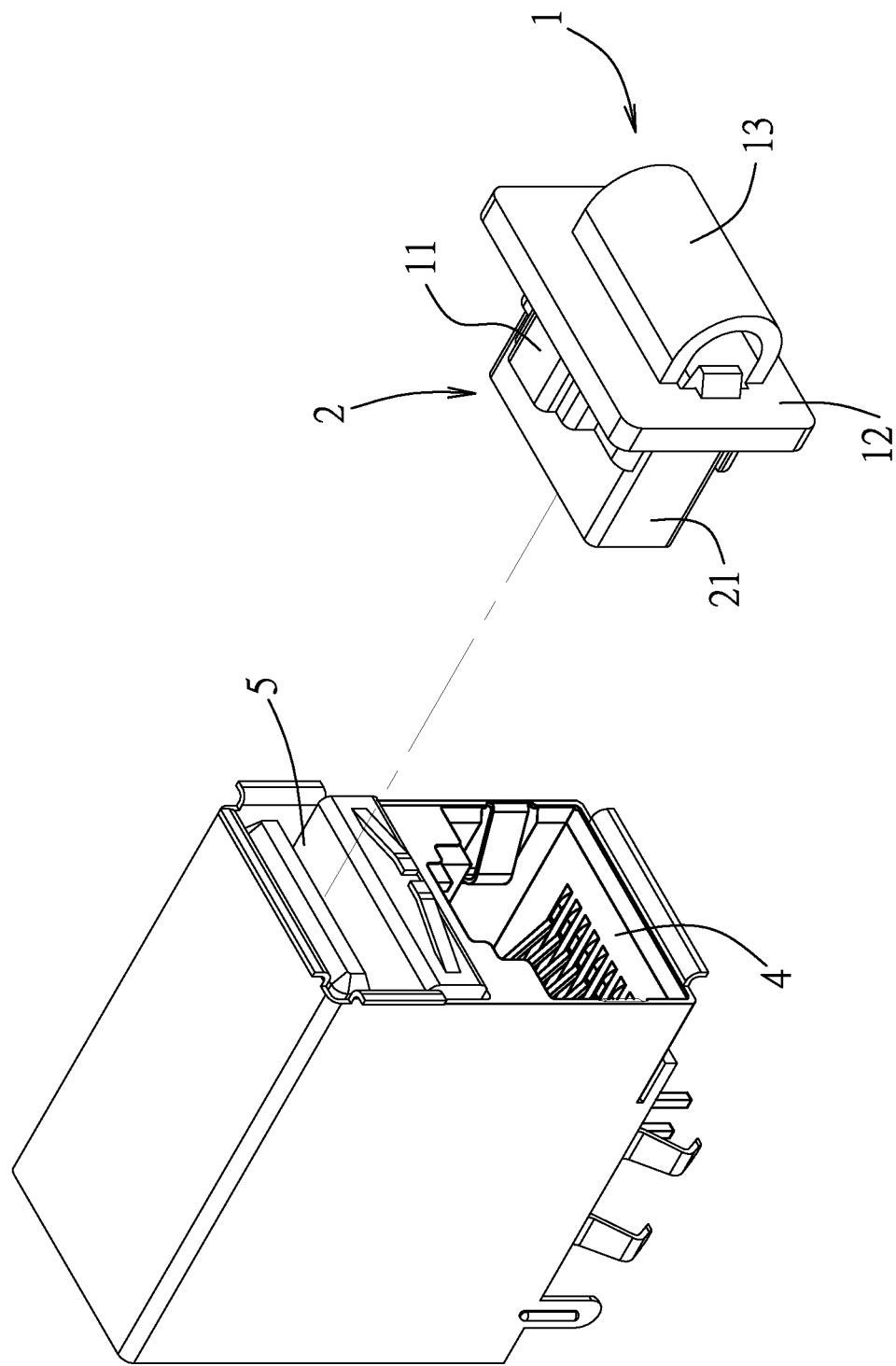
FIG. 7 is a perspective view illustrating relationships among the first component and the second component of the first embodiment and the first and second standard connection ports in a second usage scenario.
Figure 8:
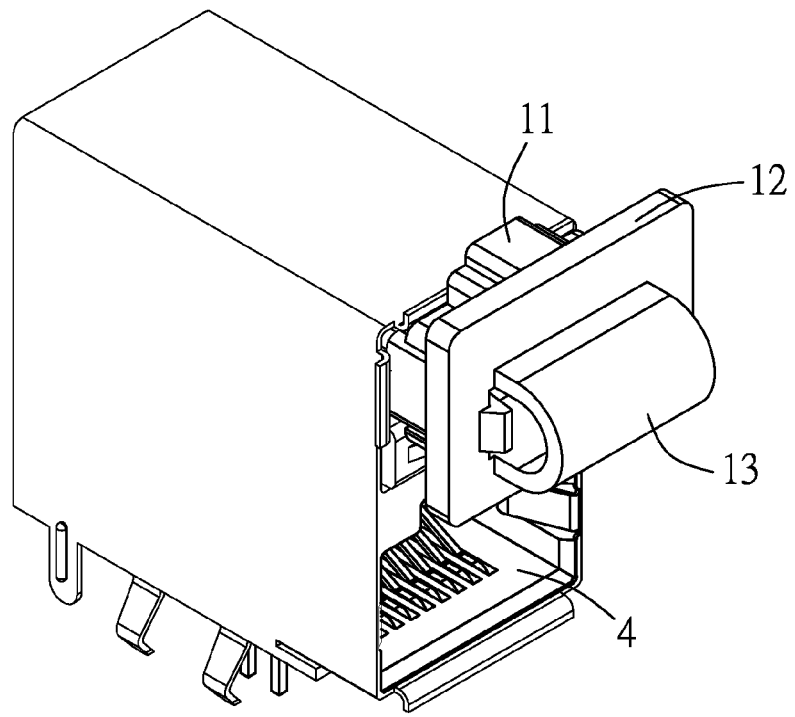
FIG. 8 is a perspective view of the first embodiment in the second usage scenario.

Referring to FIGS. 7 and 8, when the first standard connection port 4 needs to be used but not the second standard connection port 5, the first component 1, having been removed from the first standard connection port 4, may engage with the second component 2 that is inserted into the second standard connection port 5 (as shown in FIG. 8) to avoid loss of the first component 1. Since the cross-sectional areas of the first and second components 1, 2 parallel with the first base wall 12 are different, when connecting the first component 1 to the second component 2 that is already inserted into the second standard connection port 5, the first plug body 11 will eventually abut against an outer end of the second standard connection port 5 to prevent entry into the second standard connection port 5 and destroying an interior structure of the second standard connection port 5. In addition, when the first component 1 is connected to the second component 2, the second plug body 21 is prevented from excessive insertion into the second standard connection port 5, which may otherwise result in difficult removal of the second plug body 21 from the second standard connection portion 5. Once use of the first standard connection port 4 is no longer required, the first component 1 can be easily disengaged from the second component 2, and inserted back into the first standard connection port 4. As a result, the first standard connection port 4 is prevented from dust and loss of the first component 1 is avoided.

Figure 9:
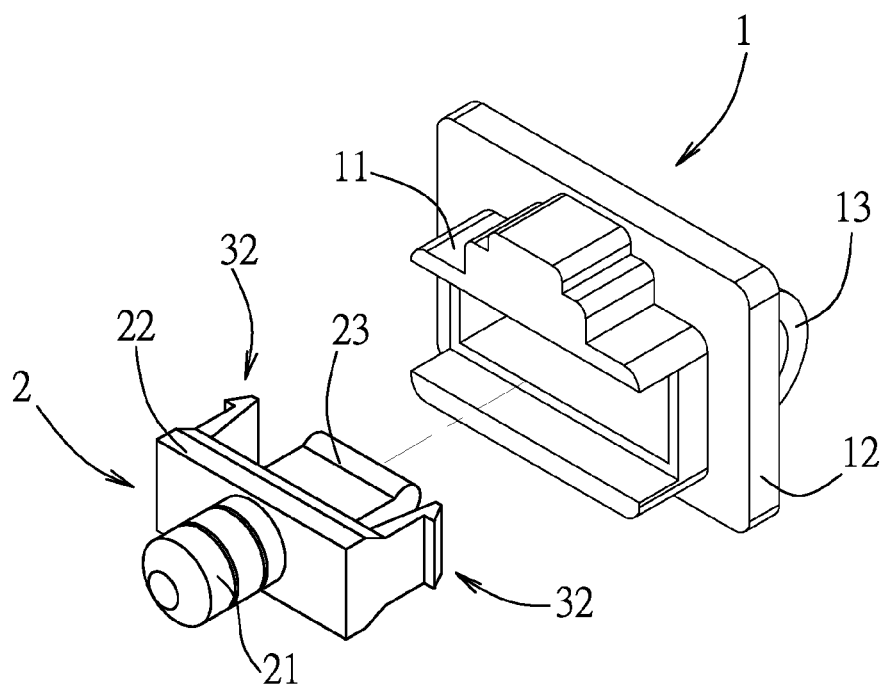
FIG. 9 is a perspective view illustrating the second embodiment of a dustproof device according to the present disclosure.

Referring to FIG. 9, the second embodiment of a dustproof device according to the present disclosure is illustrated and differs in the configuration of the second plug body 21 from the first embodiment. In the second embodiment, the second plug body 21 is suitable for an audio input/output port, such that the first plug body 11 for the RJ45 connection port is used in combination with a different second plug body 21 for another application. Since the rest of the features of the second embodiment are similar to those of the first embodiment, details of the same are omitted for brevity.

According to market demands, a manufacturer can flexibly vary the configuration of the first and/or second plug body 11, 21 for different standards. On the other hand, the user may also flexibly combine first and second components 1, 2 for different standard ports to suite his/her particular needs. In any case, regardless of whether the first component 1 and the second component 2 are connected to or separated from each other, the dustproof device of this disclosure is suitable for connecting one or a plurality of different standard ports.

To sum up, by virtue of removable engagement between the first component 1 and the second component 2 through the engaging mechanism 3, the first plug body 11 and the second plug body 21 can cooperatively or separately connect one or a plurality of different standard ports, thereby achieving the purpose of the present disclosure.

While the present disclosure has been described in connection with what are considered the most practical embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A dustproof device for use in a first standard connection port and a second standard connection port, comprising:
a first component that includes a first plug body which is pluggable into the first standard connection port;
a second component that includes a second plug body which is pluggable into the second standard connection port; and
an engaging mechanism that includes a first engaging part which is disposed on said first component, and a second engaging part which is disposed on said second component and which is removably engageable with said first engaging part, said first component being removably connected to said second component by virtue of removable engagement between said first engaging part and said second engaging part.

2. The dustproof device as claimed in claim 1, wherein one of said first engaging part and said second engaging part is an engaging hole, the other one of said first engaging part and said second engaging part being a hook unit.

3. The dustproof device as claimed in claim 2, wherein said second component extends in said first component when said first component and said second component are connected to each other by virtue of engagement between said engaging hole and said hook unit.

4. The dustproof device as claimed in claim 2, wherein said first component further includes a first base wall that is connected to said first plug body, and a first puller that is connected to said first base wall, said first base wall being disposed between said first puller and said first plug body,
wherein, when said first component and said second component are connected to each other, said first plug body and said second plug body are disposed on a same side of said first base wall, and said second plug body protrudes more than said first plug body with respect to said first base wall.

5. The dustproof device as claimed in claim 4, wherein said first engaging part of said engaging mechanism is said engaging hole, said engaging hole being formed in said first base wall of said first component, said first puller having a receiving space in communication with said engaging hole.

6. The dustproof device as claimed in claim 5, wherein said second component further includes a second base wall that is connected to said second plug body, and a second puller that is connected to said second base wall, said second base wall being disposed between said second puller and said second plug body, wherein, when said first component and said second component are connected to each other, said second puller extends through said engaging hole of said engaging mechanism and is situated inside of said receiving space.

7. The dustproof device as claimed in claim 6, wherein said second engaging part of said engaging mechanism is said hook unit, said hook unit including two hooks that are respectively disposed on two opposite sides of said second puller, each of said hooks having a connection portion that is connected to said second base wall, and a hook portion that is connected to said connection portion, wherein, when said first component and said second component are connected to each other, said hook portions of said hooks extend through said engaging hole of said engaging mechanism and engage with said first base wall of said first component.

\* \* \* \* \*